US008014964B1

(12) United States Patent  (10) Patent No.: US 8,014,964 B1
Khalsa  (45) Date of Patent: Sep. 6, 2011

(54) ELECTRICAL POWER AND ENERGY MEASUREMENT METHOD AND APPARATUS

(75) Inventor: Harnaak Singh Khalsa, Vermont South (AU)

(73) Assignee: Khalsa Research and Consultancy Pty Ltd, Vermont South (AU)

( * ) Notice: Subject to any disclaimer, the term of this patent is extended or adjusted under 35 U.S.C. 154(b) by 359 days.

(21) Appl. No.: 12/197,238

(22) Filed: Aug. 23, 2008

(51) Int. Cl.
*G01R 21/00* (2006.01)
(52) U.S. Cl. .......................................................... 702/60
(58) Field of Classification Search ...................... 702/60
See application file for complete search history.

(56) References Cited

U.S. PATENT DOCUMENTS 3,697,872 A * 10/1972 Schulz ........................... 324/142
4,672,555 A *  6/1987 Hart et al. ..................... 700/276
5,072,187 A * 12/1991 Shilo ............................. 324/623
5,508,617 A *  4/1996 Komatsu ....................... 324/379
5,673,196 A *  9/1997 Hoffman et al. ................ 702/65
6,828,771 B1 * 12/2004 Ghassemi ..................... 324/142
7,937,520 B2 *  5/2011 Lin et al. ....................... 710/315
2002/0008506 A1*  1/2002 Nakada et al. ................ 324/120
2005/0194944 A1*  9/2005 Folts et al. .................... 323/209
2006/0129339 A1*  6/2006 Bruno ............................ 702/60
2007/0194949 A1*  8/2007 Swarztrauber et al. .. 340/870.07
2010/0213766 A1*  8/2010 Swarztrauber et al. ......... 307/69

* cited by examiner

*Primary Examiner* — Aditya Bhat

(57) ABSTRACT

A method, to decompose the total instantaneous power, into active and non-active components, using the voltages and currents at the metering point; and apparatus implementing the said method. The voltage and currents are transformed into Fourier components. The Fourier currents are separated into active and non-active parts. The active and non-active currents together with the corresponding voltage are used to define the instantaneous total, fundamental and five, active and non-active, power components. Definitions of average values for these are also stated. These components, in various combinations, are useful for measurement, compensation, detection of distortion and power quality. The method can be implemented in a signal processor based power meter, analyzer or controller or used in a software based application.

34 Claims, 9 Drawing Sheets

ELECTRICAL POWER AND ENERGY MEASUREMENT METHOD AND APPARATUS

RELATED APPLICATIONS

The present application is related to U.S. Pat. No. 3,697,872, issued Oct. 10, 1972, for CIRCUIT FOR MEASURING THE POWER CONSUMPTION OF THREE PHASE LOADS, by Schulz, included by reference herein.

The present application is related to U.S. Pat. No. 4,672,555, issued Jun. 9, 1987, for DIGITAL AC MONITOR, by Hart et al., included by reference herein.

The present application is related to U.S. Pat. No. 4,937,520, issued Jun. 26, 1990, for INSTRUMENT TO MEASURE THE ERRORS OF APPARENT POWER METERS, by Arseneau et al., included by reference herein.

The present application is related to U.S. Pat. No. 5,072,187, issued Dec. 10, 1991, for METHOD AND APPARATUS FOR DETERMINING THE TOTAL HARMONIC DISTORTION AND POWER FACTOR OF A NON-LINEAR LOAD CIRCUIT, by Shilo, included by reference herein.

The present application is related to U.S. Pat. No. 5,508,617, issued Apr. 16, 1996, for ELECTRIC POWER MEASURING APPARATUS AND METHOD, by Komatsu, included by reference herein.

The present application is related to U.S. Pat. No. 5,673,196, issued Sep. 30, 1997, for VECTOR ELECTRICITY METERS AND ASSOCIATED VECTOR ELECTRICITY METERING METHODS, by Hoffman et al., included by reference herein.

The present application is related to United States patent number US 2002/0008506 A1, issued Jan. 24, 2002, for ELECTRIC POWER MEASURING METHOD, SYSTEM USING SAME AND COMPUTER-READABLE MEDIUM, by Nakada et al, included by reference herein.

The present application is related to U.S. Pat. No. 6,828,771 B1, issued Dec. 7, 2004, for ELECTRICAL POWER MEASUREMENT, by Ghassemi, included by reference herein.

The present application is related to United States patent number US 2005/0194944 A1, issued Sep. 8, 2005, for DYNAMIC REACTIVE COMPENSATION SYSTEM AND METHOD, by Folts et al., included by reference herein.

The present application is related to United States patent number US 2006/0129339 A1, issued Jun. 15, 2006, for POWER METER, by Bruno, included by reference herein.

The present application is related to United States patent number 2007/0194949, issued Aug. 23, 2007, for SYSTEMS AND METHODS FOR ELECTRICITY METERING, by Swarztrauber et al., included by reference herein.

FIELD OF THE INVENTION

The present invention relates to electric power measurement and, more particularly, to a digital or numerical power measurement method and apparatus.

BACKGROUND OF THE INVENTION

Introduction

Electric power is typically generated at a generating station or facility, usually at a remote location from a load, and transported to consumers over a transmission and distribution system. To reduce power transportation losses, a step-up generator transformer at the generating station, is used to increase the voltage and reduce the current, for transmission over the transmission system en route to transmission substations. At the transmission substation, step-down transformers are used, to decrease the voltage for sub-transmission or distribution, depending on the area serviced by an electric utility. The electric power is then finally transported to the distribution substation. At the distribution substation, distribution transformers, which are part of the electric utility's secondary power distribution system, reduce the voltage from the transmission or sub-transmission level to a distribution voltage, for delivery and use by industrial, commercial, and residential consumers. Measurement of power and energy is made at many locations along this chain of generation, transmission, distribution and delivery. This chain is collectively termed an electrical power system. The location at which the measurement is made is termed as a metering point. The part of the electrical power system, prior to the metering point is termed a source, and that part following it a load. The transmission and distribution system may be three-phase, single-phase or a mixture. A single-phase electrical system uses two conductors, while a three-phase system may have three or four conductors.

The Problem

The major problem presently experienced is measurement of powers, in the presence of harmonics and non-linear loads, in the electrical power system. The method of determination of powers also contributes to the problem. Non-linear loads have a detrimental effect on components of the power system. These give rise to harmonic power flows to other users of the supply, and contribute to a deterioration of the supply quality. In such a scenario, there is a problem experienced with accurate measurement, especially of non-active (or reactive) power. This is one of the quantities used in billing. Evaluation of the quality of the power supply, to enable allocating costs, to those causing deterioration in the power quality, is also very important. To enable this cost allocation, there is a need to identify the polluters. The method or device should indicate degradation in power quality as well as identify the source. Another important area, is mitigation equipment, used for removing unwanted polluting quantities from the power system. The measurement method or apparatus should provide accurate information for such mitigation equipment. Much research has been conducted into this problem and some of the findings are highlighted in the following paragraphs.

Many references for example (Czarnecki, L. S., Orthogonal decomposition of the currents in a 3-phase nonlinear asymmetrical circuit with a nonsinusoidal voltage source, IEEE Transactions on Instrumentation and Measurement, pp 30-34, Vol. 37, Issue 1, March 1988; F. Ghassemi, New Apparent Power and Power Factor with Non-sinusoidal Waveforms, IEEE Power Engineering Society Winter Meeting, 2000, pp 2852-2857 Vol. 4, January 2000; L. M. Tolbert, T. G. Habetler, Comparison of Time Based Nonactive Power Definitions for Active Filtering, Power Electronics Congress CIEP 2000, pp 73-79, October 2000), state that though active power has an accepted definition, there is ambiguity in defining reactive power, and this is mainly because as stated in (R. Fetea, A. Petroianu, Can the Reactive Power be Used?, Proceedings Power Systems Technology, PowerCon 2000, pp 1251-1255, Vol. 3, December 2000), its average over time is zero.

The control philosophy of compensation systems (compensators) is still a major unsolved problem. Proper control philosophy can only be derived, if the definitions of all the components of electric power, under nonsinusoidal conditions, prove to be accurate, and have an interpretation in terms of the load connected, as identified in references (J H Enslin, J D Van Wyk, A New Control Philosophy for Power Electronic Converters as Fictitious Power Compensators, 19th Annual IEEE Conference Power Electronics Specialist Conference, PESC '88, pp 1188-1196, Vol. 2, 11-14 April 1988; J H Enslin, J D Van Wyk, Measurement and Compensation of Fictitious Power Under Nonsinusoidal Voltage and Current Conditions, IEEE Transactions on Instrumentation and Measurement, pp 403-408, Vol. 37 Issue 3, September 1988).

For sinusoidal systems, powers are defined using RMS (root-mean square) quantities. The RMS based quantities, that have conventionally been used to measure electric power, are generally considered to be accurate when power is supplied to the load with a sinusoidal waveform. Adopting this directly to non-sinusoidal systems using RMS values of voltage and current is not satisfactory. This is because RMS is a derived quantity representing the current or voltage based on heating effect. Use of RMS quantity to represent a single frequency sinusoidal signal is acceptable because the frequency information is not lost, the single frequency being known. However, when a multi-frequency non-sinusoidal signal is represented with a single RMS quantity, the frequency information is lost. Additionally, the characteristics of the load are not wholly of "heating" nature, and this leads to error especially in the measurement of non-active or reactive power.

Many researchers have pointed out issues with current definitions and techniques for measuring electrical power, especially 'reactive power', under nonsinusoidal conditions. The IEEE Working group (IEEE Working Group on Nonsinusoidal Situations: Effects on Meter Performance and Definitions of Power, Practical Definitions for Powers in Systems with Unbalanced Loads: A Discussion, IEEE Transactions on Power Delivery, pp 79-101, Vol. 11 Issue 1, January 1996) indicates that present definitions are not adequate for economic studies in nonsinusoidal and/or unbalanced and/or non-linear systems. Strong practical reasons are pointed out in (F. Ghassemi, What is Wrong with Electric Power Theory and How It Should be Modified, Metering and Tariffs for Energy Supply, Conference Publication No 462, pp 109-114, May 1999) for reviewing power definitions. The author in (L. S. Czarnecki, New Power Theory of the 3-Phase Non-linear Asymmetrical Circuits Supplied from Nonsinusoidal Voltage Sources, IEEE International Symposium on Circuits and Systems, pp 1627-1630, Vol. 2, June 1988) states that there is not a power theory that explains the power properties of three-phase-asymmetrical systems under non-sinusoidal conditions. Reference (Institute of Electrical and Electronic Engineers, IEEE Standard 1459-2000—IEEE Standard Definitions for the Measurement of Electric Power Quantities Under Sinusoidal, Nonsinusoidal, Balanced, or Unbalanced Conditions, IEEE, New York, 2000) states of the need for a generalised power theory that can provide simultaneous common base for energy billing, evaluation of electric energy quality, detection of major sources of waveform distortion, and provide information for design of mitigation equipment.

Hartman (D. P. Hartman, An Electrical Utility's Experience with Nonsinusoidal Waveforms and Electrical Metering, IEEE Tutorial Course, pp 23-24, 1990) and Stevens (R. H. Stevens, Harmonics and Related Factors Affecting Metering Accuracy, IEEE Tutorial Course, pp 61-66, 1990) state that the accuracy of electricity meters is affected by nonsinusoidal waveforms. Some definitions, as the following references indicate, do not posses attributes that are related to power phenomena in circuits or the load properties (L. S. Czarnecki, Considerations on the Reactive Power in Nonsinusoidal Situations, IEEE Transactions on Instrumentation and Measurement, pp 399-404, Vol. IM-34, September 1985; L. S. Czarnecki, What is Wrong with Budeanu Concept of Reactive and Distortion Power and Why It Should be Abandoned, IEEE Transactions on Instrumentation and Measurement, pp 834-837, Vol. IM-36, September 1987; L. S. Czarnecki, On Some Misinterpretations of the Instantaneous Reactive Power p-q Theory, IEEE Transactions on Power Electronics, pp 828-836, Vol. 19, No 3, May 2004).

The presence of a source impedance, also causes inconsistent results because source impedance is neglected in definitions, as identified by (R. Sasdelli, Compensable Power for Electrical Systems in Nonsinusoidal Conditions, IEEE Transactions on Instrumentation and Measurement, pp 592-598, Vol. 43 No. 4, August 1994; A P J Rens, P H Swart, Investigating the validity of the Czarnecki three-phase power definitions, Africon Conference in Africa, $6^{th}$ IEEE Africon, pp 815-821, Vol. 2, October 2002). References (J H C Pretorius et al, An Evaluation of Some Alternative Methods of Power Resolution in a Large Industrial Plant, IEEE Transactions on Power Delivery, pp 1052-1059, Vol. 15 Issue 3, July 2000; L. M. Tolbert, T. G. Habetler, Comparison of Time Based Non-active Power Definitions for Active Filtering, Power Electronics Congress CIEP 2000, pp 73-79, October 2000) indicate that further confusion is added, because the different definitions diverge and emphasize different qualities suited to different applications. Definitions based on time-domain and frequency domain analysis do not fully agree, as pointed out in (F. Ghassemi, New Concept in AC Power Theory, IEEE Proceedings Generation, Transmission and Distribution, pp 417-424, Vol. 147 Issue 6, November 2000). References (P. S. Filipski, Polyphase Apparent Power and Power Factor Under Distorted Waveform Conditions, IEEE Transactions on Power Delivery, pp 1161-1165, Vol. 6 Issue 3, July 1991; L. S. Czarnecki, Power related phenomena in three-phase unbalanced systems, IEEE Transactions on Power Delivery, pp 1168-1176, Vol. 10, Issue 3, July 1995; Hyusong Kim et al, Spectral Analysis of Instantaneous Powers in Single-Phase and Three-Phase Systems with the use of p-q-r Theory, IEEE $32^{nd}$ Annual Power Electronics Specialist Conference, PESC 2001, pp 54-61, Vol. 1, 17-21 June 2001) point out that definitions for single-phase systems become ambiguous and controversial for three-phase, non-sinusoidal and non-linear systems.

It is therefore an object of the invention to provide, a method and apparatus that gives time-domain and average measurement of the defined active and non-active power components, which enables cost allocation, and billing of power and energy transfer, at the measuring point.

It is another object of the invention to provide, a method and apparatus that gives time-domain and average measurement of the defined active and non-active power components, which enables identification of the source of pollution of power at the measuring point.

It is another object of the invention to provide, a method and apparatus that gives time-domain and average measurement of the defined active and non-active power components, which indicates degradation of power quality at the measuring point.

It is another object of the invention to enable allocating costs, having identified the polluters and degradation in power quality, to those causing deterioration in the power quality.

It is another object of the invention to provide a method and apparatus, that gives time-domain measurement of the defined active and non-active power and power components, providing information for static mitigating equipment, which enables compensation of unwanted quantities at the metering point.

It is another object of the invention to provide a method that gives time-domain measurement of the defined active and non-active power and power components, in a software based application that enables manual determination of compensation of unwanted quantities, using passive elements (resistors, capacitors and inductors) at the metering point, as well as the objects as stated above.

SUMMARY OF THE INVENTION

In accordance with the present invention, there is provided a method to decompose the total instantaneous power into active and non-active components, using the voltages and currents measured at the measuring point and apparatus implementing this method and in doing so provide capability for measurement of power and energy, measurement and determination of information for compensation of unwanted quantities, detection of source of distortion and indication of power quality. The method is based on both the voltage and current components (components here mean DC, fundamental and harmonic). The decomposition is based on the power system properties. In addition to the fundamental, five sub-components for each of the active and non-active parts are defined. The definitions are based on both the voltage and current harmonic components (harmonic here is taken to include the fundamental). The direction of flow of the current is also determined. The current harmonic components are separated into in-phase (with the corresponding voltage harmonic) active and in-quadrature (with the corresponding voltage harmonic) non-active currents. The active and non-active currents together with the voltages are used to define the fundamental and five sub power components. Each of these components has active and non-active (or reactive) parts that combine to give the total.

The components have certain characteristics that are useful in providing information about an electrical system at the metering point. These characteristics enable the method capable for the various applications stated above as the objects of the invention.

The method can be realized in a signal processor based power meter, analyzer or controller, or in a software based application, to provide the objects of the invention.

BRIEF DESCRIPTION OF THE DRAWINGS

A complete understanding of the present invention may be obtained by reference to the accompanying drawings, when considered in conjunction with the subsequent, detailed description, in which.

For purposes of clarity, like elements and components will bear the same designations and numbering throughout the figures. In the figures the subscript "k", which designates a sample, is omitted so as to facilitate readability. For example "$v_{0k}$" will be "$v_0$" in the figures.

DESCRIPTION OF THE PREFERRED EMBODIMENT

Figure 1:
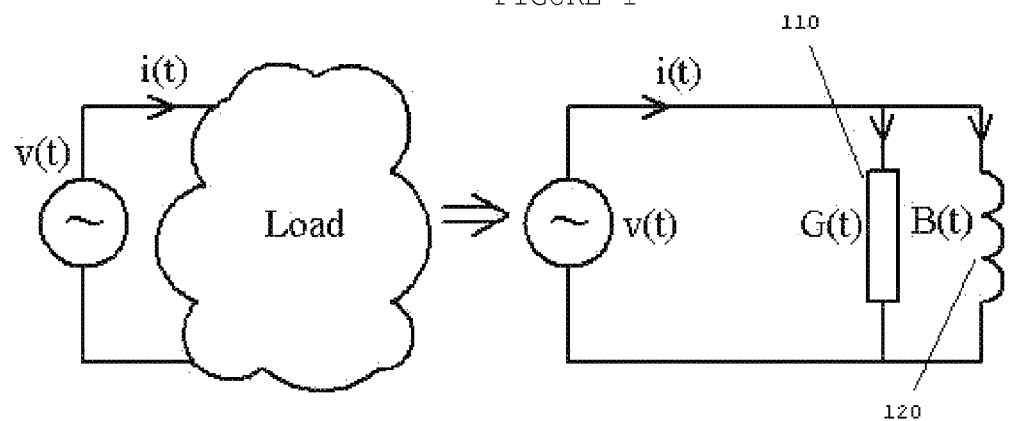
FIG. 1 is a schematic diagram of a power system source-load model.
Figure 2:
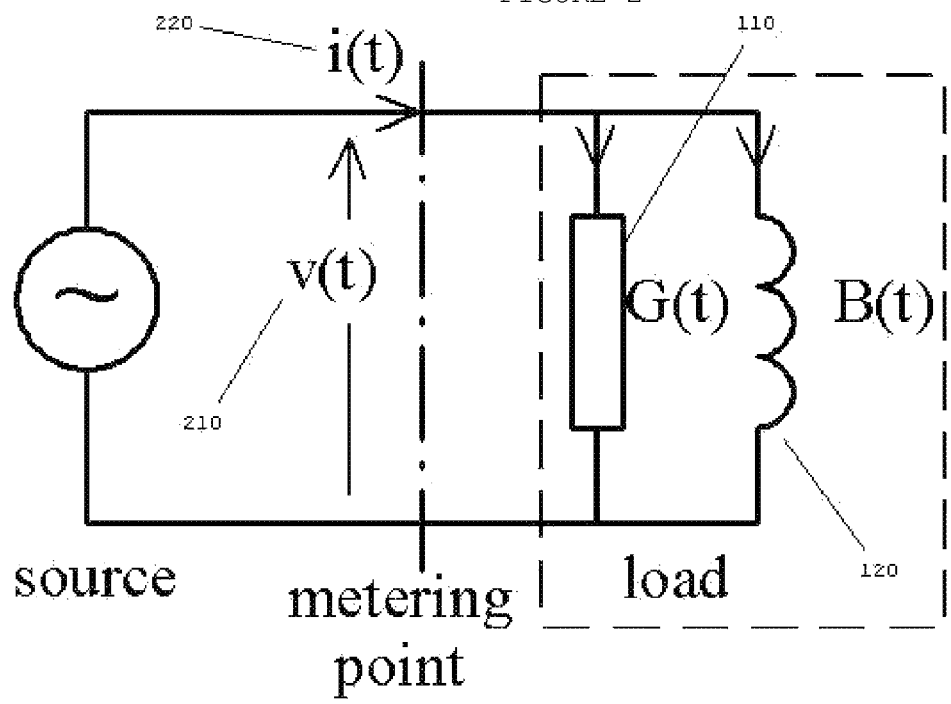
FIG. 2 is a schematic diagram illustrating a metering point.
Figure 3:
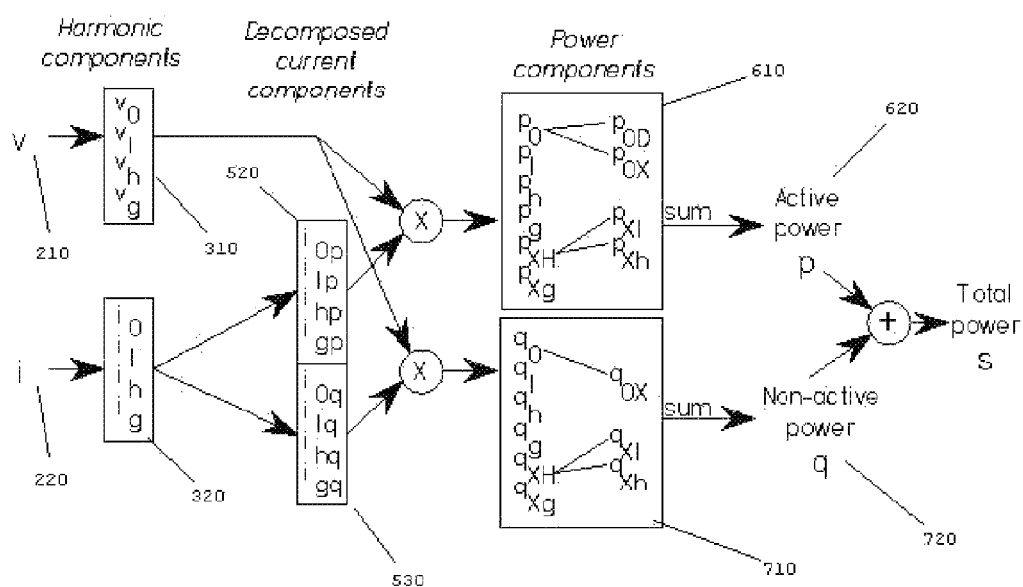
FIG. 3 is a block diagram illustrating the concept behind the method of the present invention.

FIGS. 1 to 15 illustrate the process of the method. FIGS. 1 and 2 show the link between the measuring method and the electrical power system. FIG. 3 gives the core concept of the method. FIGS. 4 to 15 expand on this concept giving more details. FIG. 16 outlines a generic measuring apparatus, an embodiment implementing the method. The method is applicable to single and three-phase electrical power systems. The single-phase system uses two conductors while the three-phase systems may have three or four conductors. The method for the single-phase system is first described followed by the three-phase system.

Single-Phase System

FIG. 1 is a schematic diagram of a source-load model. For the method, the load is represented by an equivalent parallel conductance 110 G(t) and an equivalent parallel susceptance 120 B(t). The parallel conductance and susceptance can be time variant. Active power is consumed by G(t) and non-active power results from B(t).

FIG. 2 is a schematic diagram illustrating the metering point which is the connection point between the source and the load. The source impedance may be non-zero. A metering point voltage 210 and a metering point current 220 is used by the method.

FIG. 3 is a block diagram that illustrates the core concept of the proposed method. The core concept of the method lies in instantaneous voltage, current and power components. Average values of power, power components and energy transfer are derived from these instantaneous quantities. The measured metering point voltage 210 v(t) and metering point current 220 i(t), are sampled to give magnitude $v_k$, $i_k$ (k is the $k^{th}$ sample) at the desired sampling rate, and then represented by, but not limited to, cosine Fourier components. The method for the determination of the Fourier components is well understood in the art of performing a standard transformation and as such no further description is required. The Fourier components, a voltage Fourier components 310 and a current Fourier components 320, are reflected in the equations below.

Voltage Fourier Components 310:

$$V_k = V_{0k} + V_{1k} + V_{hk} + V_{gk}$$
$$= V_{0k} + \sqrt{2}\, V_{1k}\cos(\alpha_{1k}) + \sum \sqrt{2}\, V_{hk}\cos(\alpha_{hk}) + \sum \sqrt{2}\, V_{gk}\cos(\alpha_{gk})$$

Current Fourier Components 320:

$$i_k = I_{0k} + i_{1k} + i_{hk} + i_{gk}$$
$$= I_{0k} + \sqrt{2}\, I_{1k}\cos(\beta_{1k}) + \sum \sqrt{2}\, I_{hk}\cos(\beta_{hk}) + \sum \sqrt{2}\, I_{gk}\cos(\beta_{gk})$$

where $V_{0k}$, $I_{0k}$ is DC voltage and current respectively; $V_{1k}$, $V_{hk}$, $V_{gk}$, $I_{1k}$, $I_{hk}$ and $I_{gk}$ are RMS values (capital letters for example V and I are used to represent RMS values and small letters for example v and i instantaneous values) of harmonic components $v_{1k}$, $v_{hk}$, $v_{gk}$, $i_{1k}$, $i_{hk}$ and $i_{gk}$ respectively; $\alpha_{xk}$ and $\beta_{xk}$ (x=1, h, g) the voltage and current angle respectively; obtained from the Fourier computation. "1" represents the fundamental, "h" (h∈positive integer greater than 1 and h≠g) represents a source generated voltage 410 harmonics and a source generated current 420 harmonics, and "g" (g∈positive integer greater than 1 and g≠h) a load generated voltage 430 harmonics and a load generated current 440 harmonics. The various components in this block diagram will become clearer, in the block diagrams in FIGS. 4 to 15, through which the details of the method are illustrated. A number of samples per cycle, $N_{samplesCycle}$, of the waveforms, is also important information for the method. One important point is that, there may a sampling lag time $t_{samplingLag}$, depending on the type of analog-to-digital sampling device used, between sampling of $v_k$ and $i_k$. This could lead to an angle error for each of the harmonics. Correction can be easily performed for each harmonic angle, for example, by subtracting the value given by $$\varepsilon_{samplingLag} = 2\pi \frac{t_{samplingLag}}{T} n$$

(where n is equal to 1, h or g and T is time for one cycle of the fundamental). Other techniques, known in the art, may also be employed to compensate for this time lag.

Figure 4:
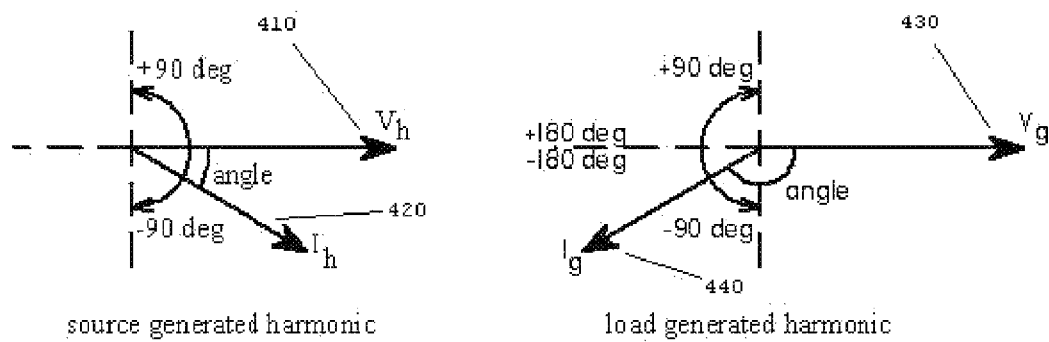
FIG. 4 is a vector diagram illustrating a determination of source and load generated harmonic currents in the method of the present invention.

The vector diagram in FIG. 4 illustrates the determination of source generated voltage 410 harmonics, source generated current 420 harmonics, load generated voltage 430 harmonics and load generated current 440 harmonics. Source generated current 420 harmonics flow from the source toward the load. Load generated current 440 harmonics flow from the load toward the source. The Fourier components of the metering point voltage 210 are used as reference to determine the direction of the currents. The direction of fundamental current, in phasor relation to the fundamental voltage, is the reference for positive direction of the source to load feed. The angle between the voltage and current harmonic for source generated harmonics lies between −90 degrees and +90 degrees inclusive. The angle between the voltage and current harmonic for load generated harmonics lies between −90 degrees and −180 degrees and between +90 degrees and +180 degrees (inclusive of +180 degrees). Note that for harmonics that arise in both the source as well as the load only the net will exist as one of the elements of "h" or "g".

Figure 5:
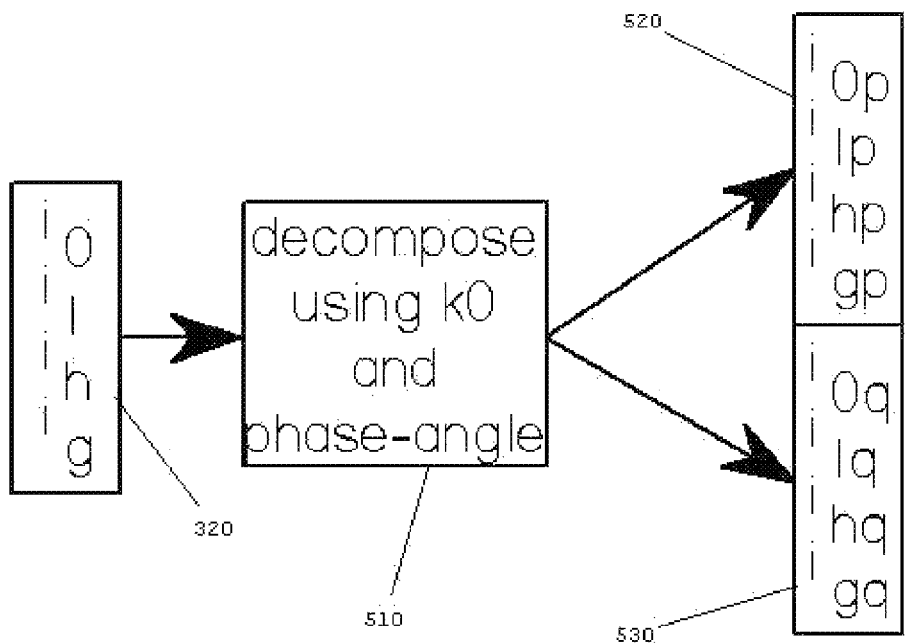
FIG. 5 is a block diagram illustrating a decomposition of currents in the method of the present invention.

FIG. 5 is a block diagram illustrating the decomposition of the currents into active and non-active parts. The current for each harmonic is separated into components, an active current components 520 (denoted by "p" in the subscript) and a non-active current components 530 (denoted by "q" in the subscript). These are given in the equations below.

Active Current Components 520:

$$i_{pk} = I_{0pk} + i_{1pk} + i_{hpk} + i_{gpk}$$

Non-Active Current Components 530:

$$i_{qk} = I_{0qk} + i_{1qk} + i_{hqk} + i_{gqk}$$

A current decomposition 510 is based on the factor k0 and the phase angle. The phase angle is zero for DC current. However, the DC current, when load generated, can contribute to active and non-active power. The DC apportioning factor "$k0_x$" gives the active part, and "$(1-k0_x)$" the contribution to the non-active part of power, when cross-multiplying with fundamental or harmonic voltage. "$k0_x$" is determined from the fundamental and harmonic phase-angle (where x=DC, 1, h or g). The DC current apportioning is proportional to the load characteristics at the fundamental or at a particular harmonic. The DC factor is given by the relationship, $$k0_{xk} = (\cos\theta_{xk})^2 \text{ if } I_0 < \sum_{n=1,h,g} I_{nk},\ k0_{xk} = 0$$

otherwise.

Note that $k0_x$ changes with harmonic (for example for DC $k_{0DC}=1$ and for fundamental $k_{01}=(\cos\theta_1)^2$). The DC factor may be assigned a different value as necessary upon further research. The RMS value of active current is $I_{0pk}=k0_{xk}I_{0k}$ and the non-active current is $I_{0qk}=(1-k_{0xk})I_{0k}$.

Angle "$\theta_m$" (where m=1 or h) is the phase angle between the fundamental or source generated harmonic voltage and the fundamental or corresponding source generated harmonic current. This is determined conventionally, that is $\theta_{mk}=\alpha_{mk}-\beta_{mk}$. The RMS values of active current is $I_{mpk}=I_{mk}\cos(\theta_{mk})$ and the non-active current is $I_{mqk}=I_{mk}\sin(\theta_{mk})$.

For load generated harmonics, if the source impedance is not negligible, $\gamma_{gk}$ is obtained from the Fourier components. As for source-generated harmonics, it is the phase angle between the load generated voltage and its corresponding current harmonic, that is, $\gamma_{gk}=\alpha_{gk}-\beta_{gk}$. When the source impedance is negligible, the determination of $\gamma_{gk}$ is based on the fundamental phase angle $\theta_{1k}$. The phase angle $\gamma_{gk}$ for harmonic "g" is then obtained from $$\gamma_{gk} = \tan^{-1}\left(\frac{\tan\theta_{1k}}{g}\right) + \pi.$$

The RMS values of active current is $I_{gpk}=I_{gk}\cos(\gamma_{gk})$ and the non-active current is $I_{gqk}=I_{gk}\sin(\gamma_{gk})$.

Table 1 tabulates the DC, fundamental and harmonic voltages, currents and corresponding phase angles.

TABLE 1

Voltage and current components

| Harmonic | Voltage (310) | Phase angle | Current (520) contributing to active power | Current (530) contributing to non-active power |
|---|---|---|---|---|
| DC | $V_0$ | 0 | $I_{0p} = I_0 k0_x$<br>x = DC, l, h, g | $I_{0q} = I_0(1 - k0_x)$<br>x = DC, l, h, g |
| Fund. | $v_{lk} =$<br>$\sqrt{2} V_{lk} \cos(\alpha_{lk})$ | $\theta_{lk} =$<br>$\alpha_{lk} - \beta_{lk}$ | $i_{lpk} =$<br>$\sqrt{2} I_{lk} \cos(\alpha_{lk}) \cos\theta_{lk}$ | $i_{lqk} =$<br>$\sqrt{2} I_{lk} \sin(\alpha_{lk}) \sin\theta_{lk}$ |
| $h^{th}$ | $v_{hk} =$<br>$\sqrt{2} V_{hk} \cos(\alpha_{hk})$ | $\theta_{hk} =$<br>$\alpha_{hk} - \beta_{hk}$ | $i_{hpk} =$<br>$\sqrt{2} I_{hk} \cos(\alpha_{hk}) \cos\theta_{hk}$ | $i_{hqk} =$<br>$\sqrt{2} I_{hk} \sin(\alpha_{hk}) \sin\theta_{hk}$ |
| $g^{th}$ | $v_{gk} =$<br>$\sqrt{2} V_{gk} \cos(\alpha_{gk})$ | $\gamma_{gk}$ | $i_{gpk} =$<br>$\sqrt{2} I_{gk} \cos(\alpha_{gk}) \cos\gamma_{gk}$ | $i_{gqk} =$<br>$\sqrt{2} I_{gk} \sin(\alpha_{gk}) \sin\gamma_{gk}$ |

Instantaneous Powers

Figure 6:
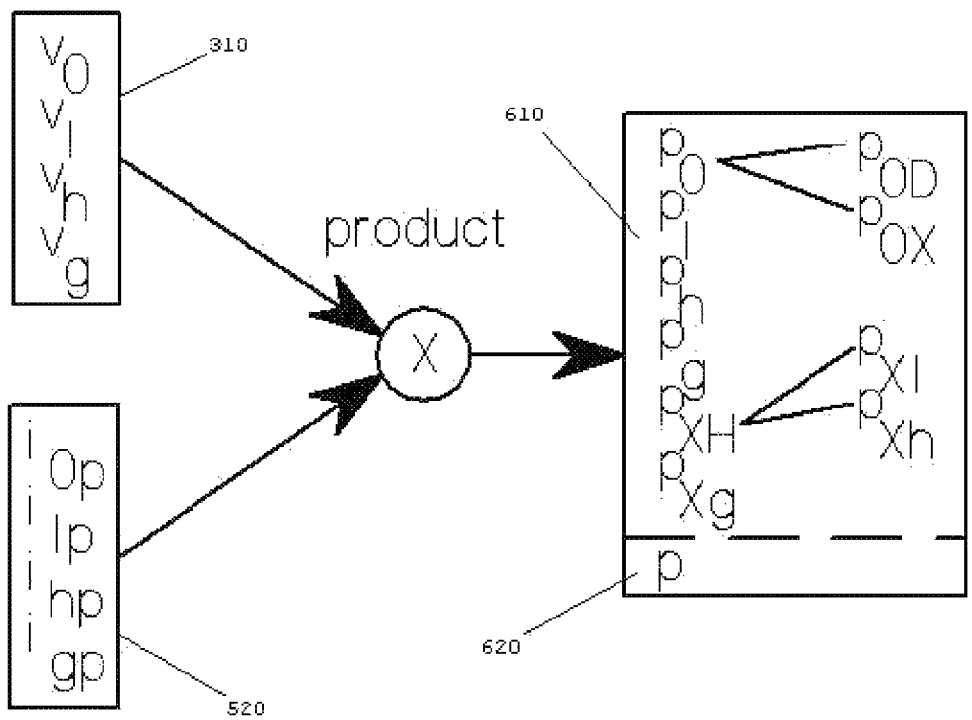
FIG. 6 is a block diagram illustrating determination of active instantaneous power and power components in the method of the present invention.

FIG. 6 is a block diagram illustrating the determination of an instantaneous active power components 610. Active power is contributed by the product of voltage Fourier components 310 and active current components 520. It includes cross-harmonic products of voltages with the active current components. The equation for this product, that is, an instantaneous active power 620, is as follows:

$$p_k = (V_{0k} + v_{1k} + v_{hk} + v_{gk})(I_{0pk} + i_{1pk} + i_{hpk} + i_{gpk})$$

The instantaneous active power 620 $p_k$ is separated into components $p_{xk}$ ("x" designates the component) as outlined below. Subscript "0D" designates the DC power component and "0X" the DC cross-harmonic component related to the DC voltage and current. "1" represents the fundamental, "h" the source generated voltage 410 and source generated current 420 harmonics, "g" the load generated voltage 430 and load generated current 440 harmonics, "X1" and "Xh" the cross-harmonic power due to source generated current 420 harmonics and "Xg" the cross-harmonic power due to load generated current 440 harmonics.

The instantaneous active power components 610 are given by the following equations:

(a) Active DC Based Power:

The active DC based power $p_0$ is made up of two sub-components, that is, DC power $p_{0D}$ and DC cross-harmonic power $p_{0X}$ with, $$p_{0k} = p_{0Dk} + p_{0Xk}.$$

(a1) Active DC Power, $$p_{0Dk} = V_{0k} I_{0k};$$

(a2) Active DC Cross-Harmonic Power:

$$p_{0Xk} = \sqrt{2} V_{0k} I_{1k} \cos(\alpha_{1k}) \cos\theta_{1k} + \sqrt{2} V_{0k} \sum I_{hk} \cos(\alpha_{hk}) \cos\theta_{hk}$$
$$+ \sqrt{2} V_{0k} \sum I_{gk} \cos(\alpha_{gk}) \cos\gamma_{gk} + \sqrt{2} V_{1k} I_{0k} \cos(\alpha_{1k}) k0_{1k}$$
$$+ \sqrt{2} \sum_{m=h,g} V_{mk} I_{0k} \cos(\alpha_{mk}) k0_{mk}$$

(b) Fundamental Active Power:

$$p_{1k} = 2 V_{1k} I_{1k} \cos^2(\alpha_{1k}) \cos\theta_{1k}$$

(c) Source Generated Harmonic Active Power:

$$p_{hk} = 2\Sigma V_{hk} I_{hk} \cos^2(\alpha_{hk}) \cos\theta_{hk}$$

(d) Load Generated Harmonic Active Power:

$$p_{gk} = 2\Sigma V_{gk} I_{gk} \cos^2(\alpha_{gk}) \cos\gamma_{gk}$$

(e) Source Generated Cross Active Power:
(e1) Cross-fundamental Active Powers, $$p_{X1k} = 2 \sum_{m=h,g} V_{mk} I_{1k} \cos(\alpha_{mk}) \cos(\alpha_{1k}) \cos\theta_{1k}$$

(e2) Cross-Harmonic Active Powers, $$p_{Xhk} = 2 \sum_{\substack{m \neq n \\ m=1,h,g \\ n=h}} V_{mk} I_{nk} \cos(\alpha_{mk}) \cos(\alpha_{nk}) \cos\theta_{nk}$$

(f) Load Generated Cross-Harmonic Active Power:

$$p_{Xgk} = 2 \sum_{\substack{m \neq n \\ m=1,h,g \\ n=g}} V_{mk} I_{nk} \cos(\alpha_{mk}) \cos(\alpha_{nk}) \cos\gamma_{nk}$$

Instantaneous Active Power 620:

$$p_k = p_{0Dk} + p_{0Xk} + p_{1k} + p_{hk} + p_{gk} + p_{X1k} + p_{Xhk} + p_{Xgk}$$

Figure 7:
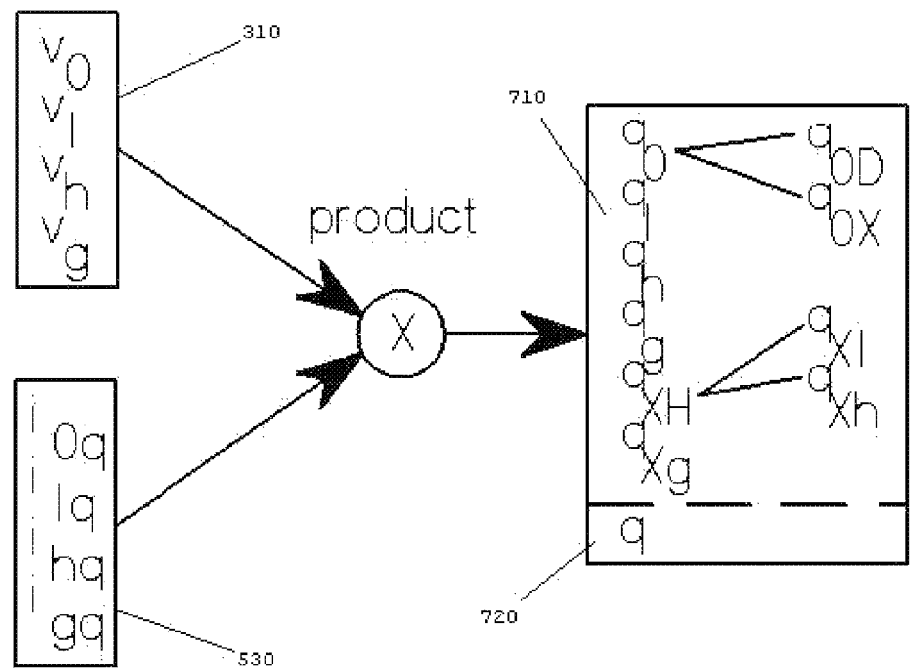
FIG. 7 is a block diagram illustrating determination of non-active instantaneous power and power components in the method of the present invention.

FIG. 7 is a block diagram illustrating the determination of an instantaneous non-active power components 710. Non-active power is contributed by the product of the voltage Fourier components 310 and the non-active current components 530. It includes cross-harmonic products of voltages with the non-active current components. The equation for this product, that is, an instantaneous non-active power 720, is given as follows:

$$q_k = (V_{0k} + v_{1k} + v_{hk} + v_{gk})(I_{0qk} + i_{1qk} + i_{hqk} + i_{gqk})$$

The instantaneous non-active power components 710 are given by the following equations:

(a) Non-Active DC Cross-Harmonic Power:

$$q_{0Xk} = \sqrt{2} V_{0k} I_{1k} \sin(\alpha_{1k}) \sin\theta_{1k} + \sqrt{2} V_{0k} \sum I_{hk} \sin(\alpha_{hk}) \sin\theta_{hk}$$
$$+ \sqrt{2} V_{0k} \sum I_{gk} \sin(\alpha_{gk}) \sin\gamma_{gk} + \sqrt{2} V_{1k} I_{0k} \cos(\alpha_{1k})(1 - k0_{1k})$$
$$+ \sqrt{2} \sum_{m=h,g} V_{mk} I_{0k} \cos(\alpha_{mk})(1 - k0_{mk})$$

(b) Fundamental Non-Active Power:

$$q_{1k} = 2 V_{1k} I_{1k} \cos(\alpha_{1k}) \sin(\alpha_{1k}) \sin\theta_{1k}$$

(c) Source Generated Harmonic Non-Active Power:

$$q_{hk} = 2\Sigma V_{hk} I_{hk} \cos(\alpha_{hk}) \sin(\alpha_{hk}) \sin\theta_{hk}$$

(d) Load Generated Harmonic Non-Active Power:

$$q_{gk} = 2\Sigma V_{gk} I_{gk} \cos(\alpha_{gk}) \sin(\alpha_{gk}) \sin\gamma_{gk}$$

(e) Source Generated Cross-Harmonic Non-Active Power:

(e1) Cross-Fundamental Non-Active Powers, $$q_{X1k} = 2 \sum_{m=h,g} V_{mk} I_{1k} \cos(\alpha_{mk}) \sin(\alpha_{1k}) \sin\theta_{1k}$$

(e2) Cross-Harmonic Non-Active Powers, $$q_{Xhk} = 2 \sum_{\substack{m \neq n \\ m=1,h,g \\ n=h}} V_{mk} I_{nk} \cos(\alpha_{mk}) \sin(\alpha_{nk}) \sin\theta_{nk}$$

(f) Load Generated Cross-Harmonic Non-Active Power:

$$q_{Xgk} = 2 \sum_{\substack{m \neq n \\ m=1,h,g \\ n=g}} V_{mk} I_{nk} \cos(\alpha_{mk}) \sin(\alpha_{nk}) \sin\gamma_{nk}$$

Instantaneous Non-Active Power 720:

$$q_k = q_{0Xk} + q_{1k} + q_{hk} + q_{gk} + q_{X1k} + q_{Xhk} + q_{Xgk}$$

Average Powers and Energy Transfer

There is a need to represent the instantaneous power and power components with a numerical value. This maintains consistence with existing practice, where powers are commonly referred to by a value (for example an active power of 27 watts). This necessitates the definition of average values. Average power components and energy transfer are determined, from the instantaneous total power and power components, using the equations that follow.

Figure 8:
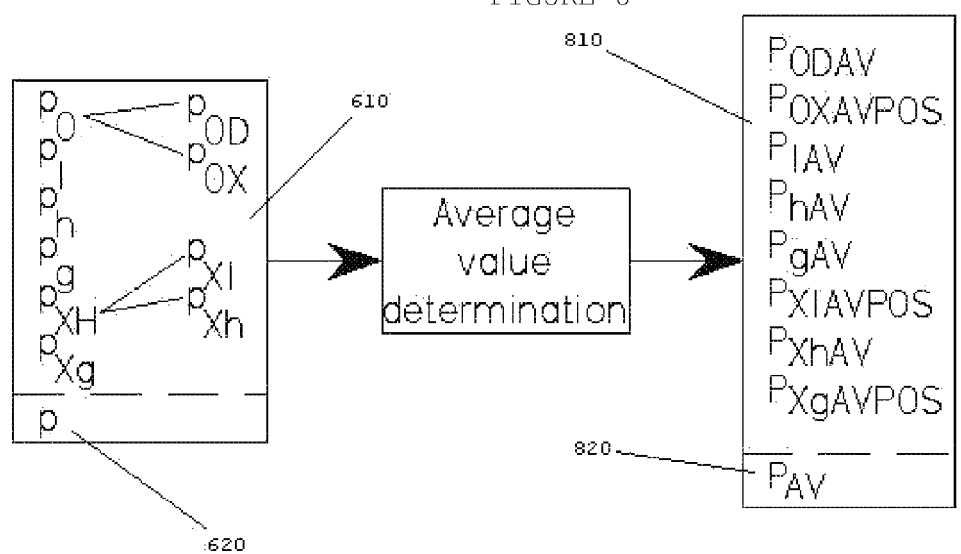
FIG. 8 is a block diagram illustrating determination of average value of active power and power components in the method of the present invention.

FIG. 8 is a block diagram illustrating the determination of the value of an average active power components 810 and an average active power 820. Due to electrical system nature it could be possible that within a period, the active power does become negative. Integral over one period could show zero power. An example of this is cross-product based active powers. It is thus necessary to define average powers with this in consideration. The average powers are determined using the following equations.

Average Positive Active Power Component:

$$Px_{AVPOS} = \frac{1}{aN_{samplesCycle}} \left( \sum_{j=(k-aN_{samplesCycle}+1)}^{k} Px_{posj} \right)$$

Average Negative Active Power Component:

$$Px_{AVNEG} = \frac{1}{aN_{samplesCycle}} \left( \sum_{j=(k-aN_{samplesCycle}+1)}^{k} Px_{negj} \right)$$

Average Active Power Component:

$$Px_{AV} = Px_{AVPOS} + Px_{AVNEG}$$

Average Positive Active Power:

$$P_{AVPOS} = \frac{1}{aN_{samplesCycle}} \left( \sum_{j=(k-aN_{samplesCycle}+1)}^{k} P_{posj} \right)$$

Average Negative Active Power:

$$P_{AVNEG} = \frac{1}{aN_{samplesCycle}} \left( \sum_{j=(k-aN_{samplesCycle}+1)}^{k} P_{negj} \right)$$

Average Active Power 820:

$$P_{AV} = P_{AVPOS} + P_{AVNEG} = \frac{1}{aN_{samplesCycle}} \left( \sum_{j=(k-aN_{samplesCycle}+1)}^{k} P_j \right)$$

where $p_{Xposk} = p_{Xk}$ if $p_{Xk} > 0$, $p_{Xposk} = 0$ otherwise; $p_{posk} = p_k$ if $p_k > 0$, $p_{posk} = 0$ otherwise (this is the positive going part of the waveform) and $p_{Xnegk} = p_{Xk}$ if $p_{Xk} < 0$, $p_{Xnegk} = 0$ otherwise; $p_{negk} = p_k$ if $p_k < 0$, $p_{negk} = 0$ otherwise (this is the negative going part of the waveform) and "X" represents the component power. For cross-harmonic active powers (a2, e and f) the $P_{Xposk}$ part is generally sufficient as a measure of the component. For the DC (a1), fundamental (b), and harmonic active powers (c and d), $p_{Xneg}$ and hence $Px_{AVNEG}$ will have zero value. The average value is determined for "a" multiple number of cycles where "a" can be 1, 2 or higher as necessary for the specific application and the use of the average value.

Table 2 summarizes the powers obtained after determination of average active power components and average active power.

TABLE 2

| Average active powers | |
|---|---|
| Average active power components 810 | |
| DC power $P_{0DAV}$ | a1 |
| DC cross power $P_{0XAVPOS}$ (or $P_{0XAVNEG}$) | a2 |
| Fundamental active power $P_{1AV}$ | b |
| Source generated harmonic active power $P_{hAV}$ | c |
| Load generated harmonic active power $P_{gAV}$ | d |
| Source generated cross fundamental active power $P_{X1AVPOS}$ (or $P_{X1AVNEG}$) | e1 |
| Source generated cross harmonic active power $P_{XhAVPOS}$ (or $P_{XhAVNEG}$) | e2 |
| Load generated cross harmonic active power $P_{XgAVPOS}$ (or $P_{XgAVNEG}$) | f |
| Average active power 820 | |
| Active power $P_{AV}$ | |

Figure 9:
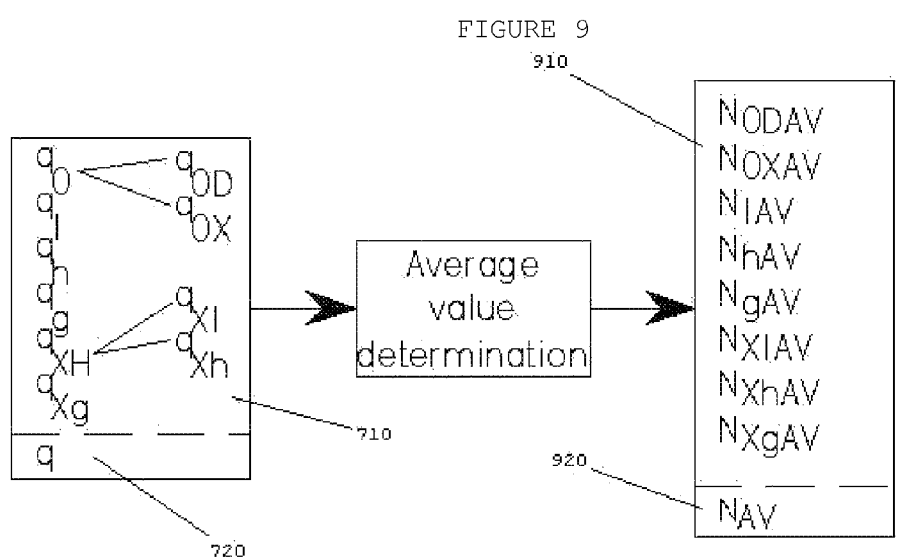
FIG. 9 is a block diagram illustrating determination of average value of non-active power components in the method of the present invention.

FIG. 9 is a block diagram illustrating the determination of value of an average non-active power components 910 and an average non-active power 920. These are determined using the following equations.

Average Non-Active Power Components 910

$$N_{xAV} = \frac{\pi}{aN_{samplesCycle}} \left( \sum_{j=(k-aN_{samplesCycle}+1)}^{k} q_{xposj} \right)$$

Average Non-Active Power 920

$$N_{AV} = \frac{\pi}{aN_{samplesCycle}} \left( \sum_{j=(k-aN_{samplesCycle}+1)}^{k} q_{posj} \right),$$

where $q_{Xposk}=q_{Xk}$ if $q_{Xk}>0$, $q_{Xposk}=0$ otherwise; $q_{posk}=q_k$ if $q_k>0$, $q_{posk}=0$ otherwise (this is the positive going part of the waveform) and "X" represents the component power. The average value is determined for "a" multiple number of cycles where "a" can be 1, 2 or higher as necessary for the specific application and the use of the average value.

Table 3 summarizes the powers obtained after determination of average non-active component powers and average non-active power.

TABLE 3

Average non-active powers

| Average non-active power components 910 | |
|---|---|
| DC $N_{0DAV}$ | a1 |
| DC cross $N_{0XAV}$ | a2 |
| Fundamental non-active $N_{1AV}$ | b |
| Source generated harmonic non-active $N_{hAV}$ | c |
| Load generated harmonic non-active $N_{gAV}$ | d |
| Source generated cross fund non-active $N_{X1AV}$ | e1 |
| Source generated cross harmonic non-active $N_{XhAV}$ | e2 |
| Load generated cross harmonic non-active $N_{XgAV}$ | f |
| Average non-active power 920 | |
| Non-active $N_{AV}$ | |

Figure 10:
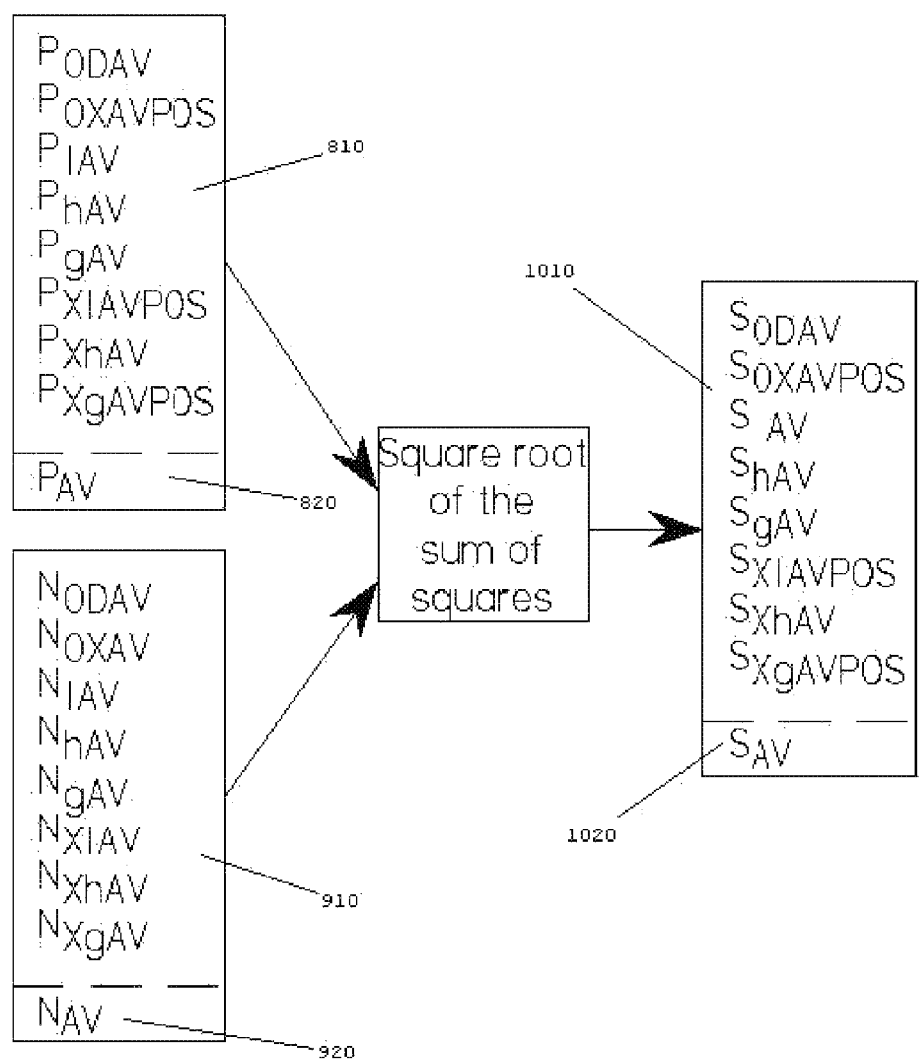
FIG. 10 is a block diagram illustrating determination of average value of total power and power components in the method of the present invention.

FIG. 10 is a block diagram illustrating the determination of value of an average total power components 1010 and an average total power 1020. The average total power components are given by $S_x = \sqrt{P_{XAV}^2 + N_{XAV}^2}$. The term "x" represents the particular average total power component. The average total power is give by $S_{AV} = \sqrt{P_{AV}^2 + N_{AV}^2}$. Table 4 below lists the average total powers.

TABLE 4

Average total powers

| Average total power component 1010 | |
|---|---|
| DC $S_{0DAV}$ | a1 |
| DC cross $S_{0XAV}$ | a2 |
| Fundamental total-active $S_{1AV}$ | b |
| Source generated harmonic total $S_{hAV}$ | c |
| Load generated harmonic total $S_{gAV}$ | d |
| Source generated cross fund total $S_{X1AV}$ | e1 |
| Source generated cross harmonic total $S_{XhAV}$ | e2 |
| Load generated cross harmonic total $S_{XgAV}$ | f |
| Average total power 1020 | |
| Total $S_{AV}$ | |

The average active, non-active and total power components can be used as indicators of power quality. For example, the percentage distortion can be represented by the component power as a percentage of the fundamental component. The fundamental component is used as reference because only the fundamental component exists when distortion is zero. Other indices, using combinations of the power components, as necessary and useful, can also be used as indicators of distortion or power quality. The direction of the fundamental is taken as positive, its flow being from source to load. The sign of the active component powers, in relation to the direction of the fundamental, indicates the direction from which that component is flowing. This can be used as an indicator of the direction of distortion.

Figure 11:
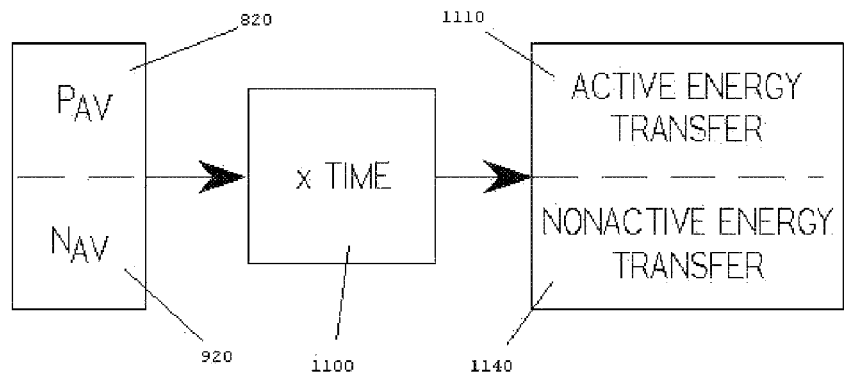
FIG. 11 is a block diagram illustrating computation of energy transfer in the method of the present invention.

FIG. 11 is a block diagram illustrating the computation of Energy Transfer. An active energy transfer 1110 $E_P$ and a non-active energy transfer 1140 $E_N$, is given by the product of the average active $P_{AV}$ or non-active $N_{AV}$ power and a time duration 1100 t as given in the following equations Active Energy Transfer 1110:

$$E_P = P_{AV} t$$

Non-Active Energy Transfer 1140:

$$E_N = N_{AV} t$$

This computation also applies to three-phase active and non-active energy determination.

Three Phase System

In a three phase system there could be three or four conductors. To quantify the metering point voltage, there is a need for a reference conductor. There is an option of a number of possibilities (A-phase, B-phase, C-phase, neutral or virtual neutral for three phase systems) for this choice. As per the IEEE 1459-2000 standard recommendation, the virtual neutral is used for three phase three wire systems and the neutral for three phase four wire systems. This does not however limit the choice of reference conductor. Special application may require the need of a different reference whence the method still applies.

The basic method as for the single-phase, outlined above still applies for the three phase system. The method is used on a per-phase to reference basis for the three phase system.

Additionally, the method includes a single equivalent three phase power and energy for the three phase system. This is mainly useful for measurement of power or energy transfer. This single equivalent power and energy transfer is also referred to as the collective power and collective energy transfer.

Figure 12:
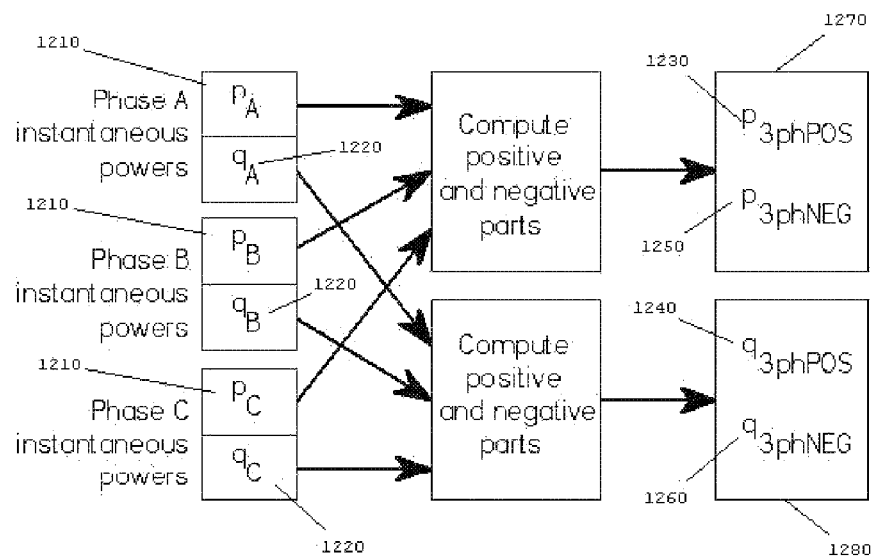
FIG. 12 is a block diagram illustrating a computation of collective instantaneous three-phase powers in the method of the present invention.

FIG. 12 is a block diagram illustrating the determination of collective three-phase instantaneous active and instantaneous non-active powers. A three-phase instantaneous active power 1270 and a three-phase instantaneous non-active power 1280, are defined by positive and negative parts from a single-phase instantaneous active power for each of the phases 1210, and a single-phase instantaneous non-active power for each of the phases 1220, according to the equations that follow. Essentially this means that each of the collective three-phase instantaneous active and non-active powers are defined by two equations, one positive part and the other the negative part. The active part could have a zero negative going part.

Instantaneous Powers

The subscripts A, B and C represent the three phases, phase A, phase B and Phase C.

A three-phase instantaneous active power 1270 is made up of a three-phase instantaneous positive active power 1230 and a three-phase instantaneous negative active power 1250.

Three-phase instantaneous positive active power 1230 power is given by, $$p_{3phPOSk} = \begin{bmatrix} p_{Ak} & \text{if } p_{Ak} \geq 0 \\ 0 & \text{otherwise} \end{bmatrix} + \begin{bmatrix} p_{Bk} & \text{if } p_{Bk} \geq 0 \\ 0 & \text{otherwise} \end{bmatrix} + \begin{bmatrix} p_{Ck} & \text{if } p_{Ck} \geq 0 \\ 0 & \text{otherwise} \end{bmatrix}$$

Three-phase instantaneous negative active power 1250 is given by, $$p_{3phNEGk} = \begin{bmatrix} p_{Ak} & \text{if } p_{Ak} < 0 \\ 0 & \text{otherwise} \end{bmatrix} + \begin{bmatrix} p_{Bk} & \text{if } p_{Bk} < 0 \\ 0 & \text{otherwise} \end{bmatrix} + \begin{bmatrix} p_{Ck} & \text{if } p_{Ck} < 0 \\ 0 & \text{otherwise} \end{bmatrix}$$

Three-phase instantaneous active power 1270 power is given by, $$p_{3phk} = p_{Ak} + p_{Bk} + p_{Ck} = p_{3phPOSk} + p_{3phNEGk}$$

Three-phase instantaneous non-active power 1280 is made up of a three-phase instantaneous positive non-active power 1240 and a three-phase instantaneous negative non-active power 1260.

Three-phase instantaneous positive non-active power 1240 is given by, $$q_{3phPOSk} = \begin{bmatrix} q_{Ak} & \text{if } q_{Ak} \geq 0 \\ 0 & \text{otherwise} \end{bmatrix} + \begin{bmatrix} q_{Bk} & \text{if } q_{Bk} \geq 0 \\ 0 & \text{otherwise} \end{bmatrix} + \begin{bmatrix} q_{Ck} & \text{if } q_{Ck} \geq 0 \\ 0 & \text{otherwise} \end{bmatrix}$$

Three-phase instantaneous negative non-active power 1260 is given by, $$q_{3phNEGk} = \begin{bmatrix} q_{Ak} & \text{if } q_{Ak} < 0 \\ 0 & \text{otherwise} \end{bmatrix} + \begin{bmatrix} q_{Bk} & \text{if } q_{Bk} < 0 \\ 0 & \text{otherwise} \end{bmatrix} + \begin{bmatrix} q_{Ck} & \text{if } p_{Ck} < 0 \\ 0 & \text{otherwise} \end{bmatrix}$$

Though presently, the need for determination of the component three-phase powers has not been identified, the above method of determination of three-phase active and non-active powers can be used to obtain three phase component powers.

Average Powers

Figure 13:
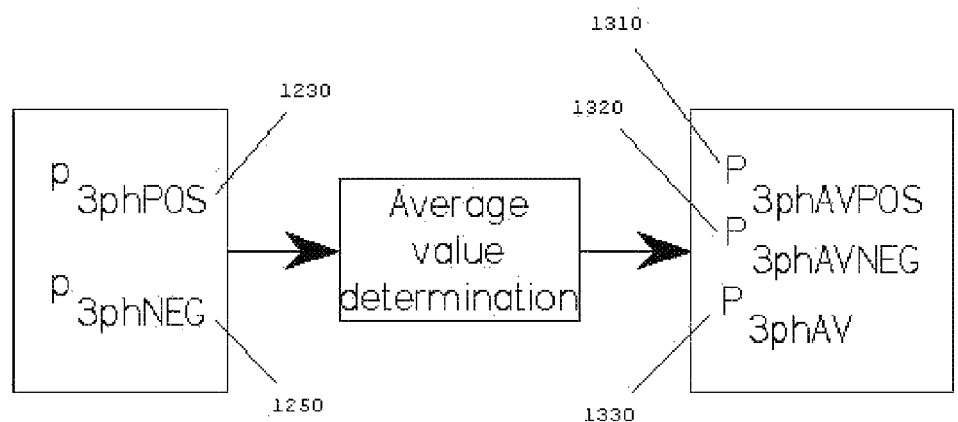
FIG. 13 is a block diagram illustrating determination of average three-phase active positive power, average active negative power and average net active power in the method of the present invention.

FIG. 13 is a block diagram illustrating the determination of average value of the active power components, a three-phase average positive active power 1310, a three-phase average negative active power 1320 and a three-phase total active power 1330. The average active powers are determined as shown below.

Three-Phase Average Positive Active Power 1310:

$$P_{3phAVPOS} = \frac{1}{aN_{samplesCycle}} \left( \sum_{j=(k-aN_{samplesCycle}+1)}^{k} p_{3phPOSj} \right)$$

Three-Phase Average Negative Active Power 1320:

$$P_{3phAVNEG} = \frac{1}{aN_{samplesCycle}} \left( \sum_{j=(k-aN_{samplesCycle}+1)}^{k} p_{3phNEGj} \right)$$

Three-Phase Average Active Power 1330:

$$P_{3phAV} =$$

$$P_{3phAVPOS} + p_{3phAVNEG} = \frac{1}{aN_{samplesCycle}} \left( \sum_{j=(k-aN_{samplesCycle}+1)}^{k} p_{3phj} \right)$$

The average value is determined for "a" multiple number of cycles where a can be 1, 2 or higher as necessary for the specific application and the use of the average value.

Figure 14:
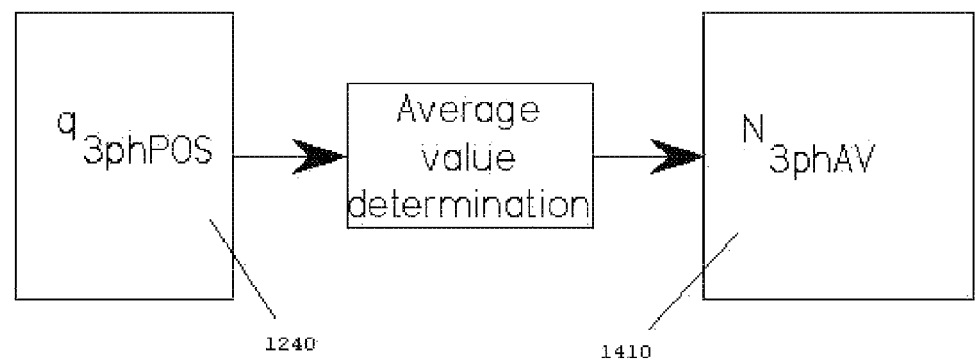
FIG. 14 is a block diagram illustrating determination of average three-phase non-active power in the method of the present invention.

FIG. 14 is a block diagram illustrating the determination of average value of a three-phase average non-active power 1410. The three-phase average non-active power 1410 is determined using the equation $$N_{3phAV} = \frac{\pi}{aN_{samplesCycle}} \left( \sum_{j=(k-aN_{samplesCycle}+1)}^{k} p_{3phPOS_j} \right)$$

The average value is determined for "a" multiple number of cycles where a can be 1, 2 or higher as necessary for the specific application and the use of the average value.

Figure 15:
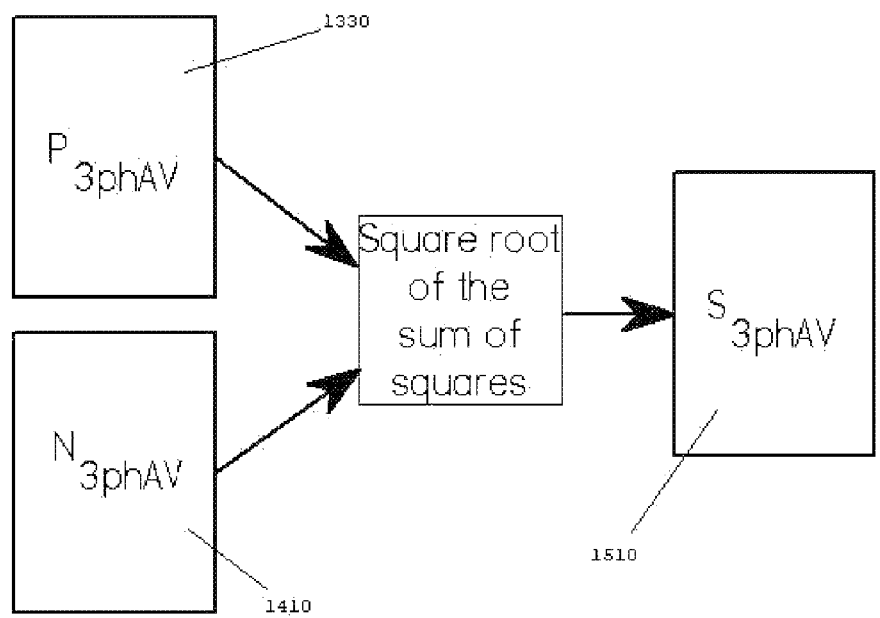
FIG. 15 is a block diagram illustrating determination of average three-phase total power in the method of the present invention.
Figure 16:
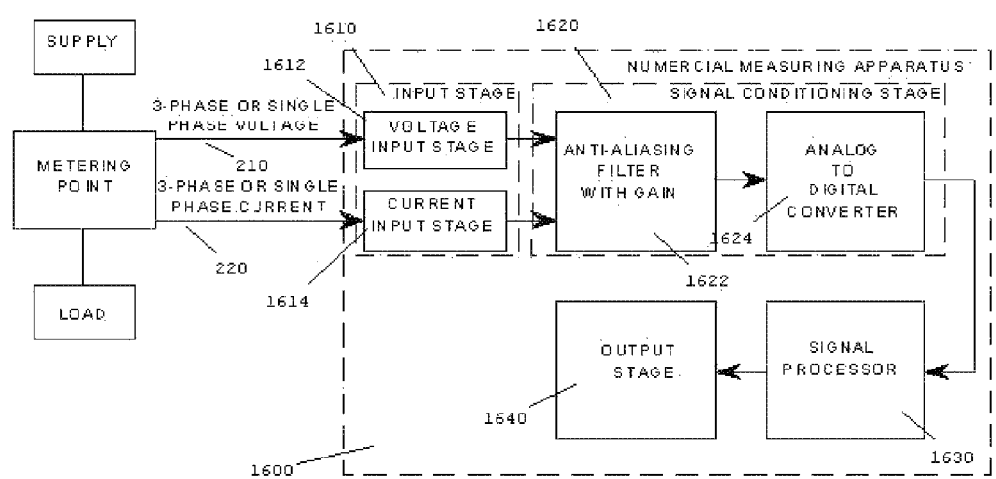
FIG. 16 is a schematic block diagram of a generic measuring apparatus implementing a method of an embodiment of the present invention.

FIG. 15 is a block diagram illustrating the determination of average value of a three-phase average total power 1510.

The three-phase average total power 1510 is given by $$S_{3phAV} = \sqrt{P_{3phAV}^2 + N_{3phAV}^2}$$

The computation of energy transfer for collective active and non active powers is done in the same manner as for the single-phase. A three-phase active energy transfer $E_{3P}$ and a three-phase non-active energy transfer $E_{3N}$ is given by the product of the average active $P_{3PhAV}$ or non-active $N_{3PhAV}$ power and time duration t as given in the equations.

Three-Phase Active Energy Transfer:

$$E_{3P} = P_{3PhAV} t,$$

Three-Phase Non-Active Energy Transfer:

$$E_{3N} = N_{3PhAV} t.$$

Though presently, the need for determination of the component three-phase average powers has not been identified, the above method of determination of three-phase average active and non-active powers can be applied to component powers.

Measuring Apparatus

Referring now to FIG. 16 that illustrates a block diagram of a generic measuring apparatus 1600, which is an embodiment implementing the method. There are four main stages in the measuring apparatus 1600 as shown in the block diagram. These are an input stage 1610, a signal conditioning stage 1620, a signal processing stage 1630 and an output stage 1640. The design, fabrication and programming of a measuring apparatus is well understood in the art of measuring apparatus design and manufacture, and as such only a brief outline of the generic measuring apparatus 1600 is given. Well known methods, procedures, components, and circuitry have not been described in detail to avoid obscuring the present invention.

Input Stage 1610

The voltage and current transformers in a voltage input stage 1612 and a current input stage 1614 scale the voltage input and current input, from the metering point, to values suitable for a signal conditioning stage 1620. This scaling is dependent on the hardware used in the signal conditioning stage 1620. The input stage may be common to the various embodiments described in the output stage 1640.

Signal Conditioning Stage 1620

An anti-aliasing filters 1622 receive the signal from the voltage and current input transformer and conditions the signal. The anti-aliasing filters 1622 are low pass filters that remove harmonics higher than the desired harmonic level suitable for the application of the apparatus. The signal is conditioned so that it is suitable as input to an analog-to-digital converter 1624. One signal conditioning stage 1620 is required for each voltage or current input signal. It is prudent, though not necessary, to design all signal conditioning stages to be identical. For this, the output from the voltage and current input transformer are conditioned to give an identical peak voltage into the anti-aliasing filters 1622. The signal condition stage may be common to the various embodiments described in the output stage 1640 section.

There will be a phase-shift of the signal at the output of the anti-aliasing filters 1622. This phase shift is frequency dependent. It can be corrected by phase shift correction in the signal conditioning stage 1620 or in the processing stage. The correction in the processing stage may be easier. The output from the anti-aliasing filters 1622 is passed onto the analog-to-digital converter 1624. The analog-to-digital converter samples the signal at a sampling rate suitable for the application. Depending on the type of analog-to-digital converter 1624 hardware used, there may be a sampling time lag which can be corrected in the processing stage. The numerical output from the analog-to-digital converter 1624 is passed to the processing stage.

Signal Processing Stage 1630

The numerical data from the analog-to-digital converter 1624 is represented with Fourier components using the Fast Fourier Transform (FFT) function library of the signal processor. The FFT library is included as a part of the programming software that is used for programming the signal processing hardware. The method, outlined in FIGS. 3 to 15 and described above, is implemented in program code in the signal processing stage 1630. The program code and function libraries are specific to the hardware used. The processing stage may be programmed with different program codes to meet the requirements of the various applications described in the output stage 1640

Output Stage 1640

The output stage 1640 is dependent on the application of the measuring apparatus 1600. If used as a power and energy measuring device, there is a display which can selectively show the different measured average powers and/or energy values. If used as a power quality device the average values of the component powers and power quality indices can additionally be displayed. If used as a measuring device for compensation equipment, the instantaneous values of the component powers are required to provide information, which will be utilized in the compensating equipment. As a power quality monitor, the average values of the power components and the power quality indices are used. These different output types are outlined in section "Application of method and apparatus" in more detail. The output information can also be directed to serial ports for remote communications or written to memory as storage for subsequent use.

Application of Method and Apparatus

The major advantage of the method is that it has multiple applications or uses while presently different unrelated methods are used for different applications. The method provides a solution to the issue of defining non-active or reactive power especially under non-sinusoidal and non-liner conditions. Since the method uses the individual frequencies, it does not suffer from inaccuracy due to loss of frequency information.

The components have certain characteristics that provide information useful for different applications. Some of these characteristics are listed below. For the identification of components (a) to (f) refer to Tables 2, 3 and 4.

For sinusoidal sources with linear load only component (b) exists. Components (a), (d) and (f) will arise when the load, as viewed from the metering point, is non-linear and the source does not have DC content. Component (a1) DC power will exist solely, only if the source is DC and load linear. Component (c) and (e) will be present when voltage harmonics exist in the source supplying a linear load.

If (c) and (e) are present, then it is possible to fully compensate the non-active power using passive components (for example capacitors and inductors). On the other hand if components (a), (d) and (f) are present, then passive components alone may not be sufficient to provide complete non-active power compensation. It is possible to remove (d) and (f) by filtering out the load generated current 440 Ig. Active compensation is required to compensate (a). Components (a) to (f) can be utilized to gauge power quality. Components (a1), (b), (c) and (d) are directional. The direction can be used to detect the source of that component at the metering point. This enables detection of the source of the unwanted component at the metering point. Component (b) is used to define the positive direction of power flow (source to load). Components (a1), (c) and (d) are the main components that can be used to detect the source of pollution. Components (a2), (e2) and (f) are supporting components for (a1), (c) and (d) respectively, in decision-making. This is important because components (a1), (c) and (d) could be quite small in value to make a definitive decision.

The characteristics listed above are not to be interpret as limiting. Since the method is new, more useful characteristics may be identified with further use of, and research into the method.

The application areas of the invention are now stated. The components mentioned in the application are examples and do not limit the use of other components in any particular application.

Measurement and Metering:

Knowledge of the time profile of the powers allows accurate measurement of the powers (especially non-active). The average values, for example 820, 920, 1020, 1330, 1410 and 1510, can be used for metering and billing purposes.

Compensation:

Knowledge of the time profile of the instantaneous active and non-active powers, as well as the different components, facilitates the selective reduction of the source current. The instantaneous components, for example 610, 620, 710 and 720, give information to be used for removal of unwanted currents/powers and reduction of source current, as well as improve the source voltage and current waveform. This information can be utilized by mitigation equipment to perform compensation.

Source of Distortion:

Power components, for example 810 (*a*) to (*f*) and 910 (*a*) to (*f*), can be used to identify the source of the distortion in power systems. This is achieved by using the directional information available from the active power components, supported by the corresponding cross-harmonic power component.

Power Quality:

The presence of the power components, for example 810 (*a*), 910(*a*) and 1010(*a*) DC based power, 810(*c*), 910(*c*) and 1010(*c*) source generated harmonic power, 810(*d*), 910(*d*) and 1010(*d*) load generated harmonic power, 810(*e*), 910(*e*) and 1010(*e*) source generated cross-harmonic, 810(*f*), 910(*f*) and 1010(*f*) load generated cross-harmonic power, can be used as an indication of power quality.

The method can be realized in signal processor based power meter, analyzer or controller or in software based application to provide the objects of the invention.

The present invention is based on a novel appreciation of the definitions of electric power parameters. These definitions are the subject of complex mathematical analysis which are necessary to explain the characteristics for single phase and three phase power systems. In order to better understand the new theories underlying the present invention, reference should be made to a thesis, authored by the inventor Harnaak Singh Khalsa, entitled "Generalised Power Components Definitions for Single and Three phase Electrical Power System under non-sinusoidal and nonlinear conditions", available at "http://arrow.monash.edu.au/hdl/1959.1/42420".

Having described generic embodiments of the present invention, it is to be appreciated that the embodiments in question are exemplary only, and that variations and modifications and developments, such as will occur to those possessing the appropriate knowledge and skills, may be made without departure from the spirit and scope of the invention, as set forth in the appended claims. For example, whilst the present method uses cosine Fourier components in the description, the sine Fourier components could also be used. As another example, future voltage and current measurement devices making the metering point measurement could give numerical output into the input stage whence input voltage and current transformers may not be necessary. As yet another example, developments could lead to measuring apparatus, employing means other than numerical, which could also implement this method in its process.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

The terms and expressions that have been employed in the foregoing specification are used as terms of description and not of limitation and there is no intention, in the use of such terms and expressions, of excluding equivalents of the features shown and described or portions thereof, it being recognized that the scope of the invention is defined and limited only by the claims that follow.

Having thus described the invention, what is desired to be protected by Letters Patent is presented in the subsequently appended claims.

What is claimed is:

1. An electrical power and energy measurement method for decomposing the total instantaneous power into instantaneous as well as average active and non-active power components using voltages and currents measured at the metering point and in doing so providing capability for measuring power and energy, measuring and determining information for compensating unwanted quantities, detecting source of distortion and indicating power quality, comprising:

determining current Fourier components using the currents(s) measured at the metering point;

determining voltage Fourier components using the voltage(s) measured at the metering point;

detecting source generated dc, fundamental and/or harmonic current and voltage components, for each of the said current Fourier components; and for each of the said voltage Fourier components;

detecting load generated dc, fundamental and/or harmonic current and voltage components, for each of the said current Fourier components; and for each of the said voltage Fourier components;

decomposing the said current Fourier components into active and non-active parts;

determining active current components comprising both source generated and load generated, for each of the said detected load generated dc, fundamental and/or harmonic current components, using the said decomposition of current Fourier components into active and non-active parts;

determining non-active current components comprising both source generated and load generated, for each of the said detected load generated dc, fundamental and/or harmonic current components, using the said decomposition of current Fourier components into active and non-active parts;

determining instantaneous active power components comprising both source generated and load generated, using the said active current components comprising both source generated and load generated, and the said voltage Fourier components;

determining instantaneous active power, using the said instantaneous active power components comprising both source generated and load generated;

determining instantaneous non-active power components comprising both source generated and load generated, using the said non-active current components comprising both source generated and load generated, and using the said voltage Fourier components;

determining instantaneous non-active power, using the said instantaneous non-active power components comprising both source generated and load generated;

determining average active power components comprising both source generated and load generated, using the said instantaneous active power components comprising both source generated and load generated;

determining average active power, using the said instantaneous active power;

determining average non-active power components comprising both source generated and load generated, using the said instantaneous non-active power components comprising both source generated and load generated;

determining average non-active power, using the said instantaneous non-active power;

determining average total power components comprising both source generated and load generated, using the said average non-active power components comprising both source generated and load generated, and using the said average active power components comprising both source generated and load generated;

determining average total power, using the said average non-active power, and using the said average active power;

measurement of time duration for energy computation;

determining active energy transfer, using the said measured time duration for energy computation, and using the said average active power;

determining non-active energy transfer, using the said measured time duration for energy computation, and using the said average non-active power;

determining single-phase instantaneous active power for each of the three phases;

determining single-phase instantaneous non-active power for each of the three phases;

determining three-phase instantaneous positive active power, using the said single-phase instantaneous active power for each of the three phases;

determining three-phase instantaneous negative active power, using the said single-phase instantaneous active power for each of the three phases;

determining three-phase instantaneous positive non-active power, using the said single-phase instantaneous non-active power for each of the three phases;

determining three-phase instantaneous negative non-active power, using the said single-phase instantaneous non-active power for each of the three phases;

determining three-phase average positive active power, using the said three-phase instantaneous positive active power;

determining three-phase average negative active power, using the said three-phase instantaneous negative active power;

determining three-phase average active power, using the said three-phase average negative active power, and using the said three-phase average positive active power;

determining three-phase average non-active power, using the said three-phase instantaneous positive non-active power;

determining three-phase average total power, using the said three-phase average non-active power, and using the said three-phase average active power;

determining three-phase active energy transfer, using the said three-phase average active power, and using the said measured time duration for energy computation;

determining three-phase non-active energy transfer, using the said three-phase average non-active power, and using the said measured time duration for energy computation.

2. The electrical power and energy measurement method in accordance with claim 1, wherein said detecting source generated dc, fundamental and/or harmonic current components provides a source generated current and voltage components.

3. The electrical power and energy measurement method in accordance with claim 1, wherein said detecting load generated dc, fundamental and/or harmonic current components provides a load generated current and voltage components.

4. The electrical power and energy measurement method in accordance with claim 1, wherein said decomposing current Fourier components into active and non-active parts comprising a current decomposition.

5. The electrical power and energy measurement method in accordance with claim 1, wherein said determining active current components comprising both source generated and load generated using current decomposition provides an active current components.

6. The electrical power and energy measurement method in accordance with claim 1, wherein said determining non-active current components comprising both source generated and load generated using current decomposition provides a non-active current components.

7. The electrical power and energy measurement method in accordance with claim 1, wherein said determining instantaneous active power components comprising both source generated and load generated provides an instantaneous active power components.

8. The electrical power and energy measurement method in accordance with claim 1, wherein said determining instantaneous active power provides an instantaneous active power.

9. The electrical power and energy measurement method in accordance with claim 1, wherein said determining instantaneous non-active power components comprising both source generated and load generated provides an instantaneous non-active power components.

10. The electrical power and energy measurement method in accordance with claim 1, wherein said determining instantaneous non-active power provides an instantaneous non-active power.

11. The electrical power and energy measurement method in accordance with claim 1, wherein said determining average active power components comprising both source generated and load generated provides an average active power components.

12. The electrical power and energy measurement method in accordance with claim 1, wherein said determining average active power provides an average active power.

13. The electrical power and energy measurement method in accordance with claim 1, wherein said determining average non-active power components comprising both source generated and load generated provides an average non-active power components.

14. The electrical power and energy measurement method in accordance with claim 1, wherein said determining average non-active power provides an average non-active power.

15. The electrical power and energy measurement method in accordance with claim 1, wherein said determining average total power components comprising both source generated and load generated provides an average total power components.

16. The electrical power and energy measurement method in accordance with claim 1, wherein said determining average total power provides an average total power.

17. The electrical power and energy measurement method in accordance with claim 1, wherein said determining single-phase instantaneous active power for each of the three phases provides a single-phase instantaneous active power for each of the phases.

18. The electrical power and energy measurement method in accordance with claim 1, wherein said determining single-phase instantaneous non-active power for each of the three phases provides a single-phase instantaneous non-active power for each of the phases.

19. The electrical power and energy measurement method in accordance with claim 1, wherein said determining three-phase instantaneous positive active power provides a three-phase instantaneous positive active power.

20. The electrical power and energy measurement method in accordance with claim 1, wherein said determining three-phase instantaneous negative active power provides a three-phase instantaneous negative active power.

21. The electrical power and energy measurement method in accordance with claim 1, wherein said determining three-phase instantaneous positive non-active power provides a three-phase instantaneous positive non-active power.

22. The electrical power and energy measurement method in accordance with claim 1, wherein said determining three-phase instantaneous negative non-active power provides a three-phase instantaneous negative non-active power.

23. The electrical power and energy measurement method in accordance with claim 1, wherein said determining three-phase average positive active power provides a three-phase average positive active power.

24. The electrical power and energy measurement method in accordance with claim 1, wherein said determining three-phase average negative active power provides a three-phase average negative active power.

25. The electrical power and energy measurement method in accordance with claim 1, wherein said determining three-phase average active power provides a three-phase average active power.

26. The electrical power and energy measurement method in accordance with claim 1, wherein said determining three-phase average non-active power provides a three-phase average non-active power.

27. The electrical power and energy measurement method in accordance with claim 1, wherein said determining three-phase average total power provides a three-phase average total power.

28. The electrical power and energy measurement method in accordance with claim 1, wherein said determining three-phase active energy transfer provides a three-phase active energy transfer.

29. The electrical power and energy measurement method in accordance with claim 1, wherein said determining three-phase non-active energy transfer provides a three-phase non-active energy transfer.

30. An electrical power and energy measurement apparatus, for decomposing the total instantaneous power into instantaneous as well as average active and non-active power components using voltages and currents measured at the metering point and in doing so providing capability for measuring power and energy, measuring and determining information for compensating unwanted quantities, detecting source of distortion and indicating power quality, comprising:
   means for converting and scaling the voltage(s) input measured at the metering point so that it is suitable for the signal conditioning stage;
   means for converting and scaling the current(s) input measured at the metering point so that it is suitable for the signal conditioning stage;
   means for signal anti-aliasing and gain adjustment suitable for the analog-to-digital conversion, functionally connected to said means for converting and scaling the current input, and functionally connected to said means for converting and scaling the voltage input;
   means for analog-to-digital conversion, functionally connected to said means for signal anti-aliasing and gain adjustment;
   means for implementation of the method according to claim 1, functionally connected to said means for analog-to-digital conversion; and
   means for provision of output using implementation of method according to claim 1 related to the particular application of the measuring apparatus to meet the objects of the invention, functionally connected to said means for implementation of the method.

31. The electrical power and energy measurement apparatus in accordance with claim 30, wherein said means for implementation of the method comprises a hardware and software signal processing stage.

32. The electrical power and energy measurement apparatus in accordance with claim 30, wherein said means for provision of output related to the particular application of the measuring apparatus to meet the objects of the invention comprises a hardware and software output stage.

33. An electrical power and energy measurement apparatus, for decomposing the total instantaneous power into instantaneous as well as average active and non-active power components using voltages and currents measured at the metering point and in doing so providing capability for measuring power and energy, measuring and determining information for compensating unwanted quantities, detecting source of distortion and indicating power quality, comprising:
   a hardware and software voltage input stage, for converting and scaling the voltage input suitable for the signal conditioning stage, functionally connected to the voltage(s) input measured at the metering point;
   a hardware and software current input stage, for scaling the current input suitable for the signal conditioning stage, functionally connected to the current(s) input measured at the metering point;
   a hardware and software anti-aliasing filters, for signal anti-aliasing and gain adjustment suitable for the analog-to-digital conversion, functionally connected to said current input stage, and functionally connected to said voltage input stage;
   a hardware and software analog-to-digital converter, for analog-to-digital conversion, functionally connected to said anti-aliasing filters;
   a hardware and software signal processing stage, for implementation of the method according to claim 1, functionally connected to said analog-to-digital converter; and
   a hardware and software output stage, for provision of output related to the particular application of the measuring apparatus to meet the objects of the invention, functionally connected to said signal processing stage.

34. An electrical power and energy measurement apparatus for decomposing the total instantaneous power into instantaneous as well as average active and non-active power components using voltages and currents measured at the metering point and in doing so providing capability for measuring power and energy, measuring and determining information for compensating unwanted quantities, detecting source of distortion and indicating power quality, comprising:
   a voltage Fourier components, obtained from the determination of voltage Fourier components, using the voltage(s) measured at the metering point;
   a current Fourier components, obtained from the determination of current Fourier components, using the said current(s) measured at the metering point;
   a current decomposition, for decomposing the current Fourier components into active and non-active parts;
   a source generated currents and voltages, obtained from the detection of source generated dc, fundamental and/or harmonic current components, using the said current Fourier components, and using the said voltage Fourier components;
   a load generated currents and voltages, obtained from the detection of load generated dc, fundamental and/or harmonic current components, using the said current Fourier components, and using the said voltage Fourier components;
   an active current components, obtained from the determination of active current components comprising both source generated and load generated, using the said load generated currents, using the said source generated currents, using the voltage Fourier components, and using the said current decomposition;
   a non-active current components, obtained from the determination of non-active current components comprising both source generated and load generated, using the said load generated currents, using the said source generated currents, using the voltage Fourier components, and using the said current decomposition;
   an instantaneous active power components, obtained from the determination of instantaneous active power components comprising both source generated and load generated, using the said active current components both load and source generated, and using the said voltage Fourier components;
   an instantaneous active power, obtained from the determination of instantaneous active power, using said instantaneous active power components;
   an instantaneous non-active power components, obtained from the determination of instantaneous non-active power components comprising both source generated and load generated, using the said non-active current components both source generated and load generated, and using the said voltage Fourier components;
   an instantaneous non-active power, obtained from the determination of instantaneous non-active power, using the said instantaneous non-active power components;
   an average active power components, obtained from the determination of average active power components comprising both source generated and load generated, using the said instantaneous active power components;

an average active power, obtained from the determination of average active power, using the said instantaneous active power;

an average non-active power components, obtained from the determination of average non-active power components comprising both source generated and load generated, using the said instantaneous non-active power components;

an average non-active power, obtained from the determination of average non-active power, using the said instantaneous non-active power;

an average total power components, obtained from the determination of average total power components comprising both source generated and load generated, using the said average non-active power components, and using the said average active power components;

an average total power, obtained from the determination of average total power, using the said average non-active power, and using the said average active power;

a time duration, obtained from the measurement of time duration for energy computation;

an active energy transfer, obtained from the determination of active energy transfer, using the said time duration, and using the said average active power;

a non-active energy transfer, obtained from the determination of non-active energy transfer, using the said time duration, and using the said average non-active power;

a single-phase instantaneous active power for each of the phases, obtained from the determination of single-phase instantaneous active power for each of the three phases;

a single-phase instantaneous non-active power for each of the phases, obtained from the determination of single-phase instantaneous non-active power for each of the three phases;

a three-phase instantaneous positive active power, obtained from the determination of three-phase instantaneous positive active power, using the said single-phase instantaneous active power for each of the phases;

a three-phase instantaneous negative active power, obtained from the determination of three-phase instantaneous negative active power, using the said single-phase instantaneous active power for each of the phases;

a three-phase instantaneous positive non-active power, obtained from the determination of three-phase instantaneous positive non-active power, using the said single-phase instantaneous non-active power for each of the phases;

a three-phase instantaneous negative non-active power, obtained from the determination of three-phase instantaneous negative non-active power, using the said single-phase instantaneous non-active power for each of the phases;

a three-phase average positive active power, obtained from the determination of three-phase average positive active power, using the said three-phase instantaneous positive active power;

a three-phase average negative active power, obtained from the determination of three-phase average negative active power, using the said three-phase instantaneous negative active power;

a three-phase average active power, obtained from the determination of three-phase average active power, using the said three-phase average negative active power, and using the said three-phase average positive active power;

a three-phase average non-active power, obtained from the determination of three-phase average non-active power, using the said three-phase instantaneous positive non-active power;

a three-phase average total power, obtained from the determination of three-phase average total power, using the said three-phase average non-active power, and using the said three-phase average active power;

a three-phase active energy transfer, obtained from the determination of three-phase active energy transfer, using the said three-phase average active power, and using the said time duration;

a three-phase non-active energy transfer, obtained from the determination of three-phase non-active energy transfer, using the said three-phase average non-active power, and using the said time duration.

* * * * *